(12) United States Patent
Yokouchi et al.

(10) Patent No.: US 7,535,688 B2
(45) Date of Patent: May 19, 2009

(54) METHOD FOR ELECTRICALLY DISCHARGING SUBSTRATE, SUBSTRATE PROCESSING APPARATUS AND PROGRAM

(75) Inventors: Takeshi Yokouchi, Miyagi (JP); Fumiko Yagi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 109 days.

(21) Appl. No.: 11/373,166

(22) Filed: Mar. 13, 2006

(65) Prior Publication Data

US 2006/0215338 A1 Sep. 28, 2006

Related U.S. Application Data

(60) Provisional application No. 60/666,715, filed on Mar. 31, 2005.

(30) Foreign Application Priority Data

Mar. 25, 2005 (JP) ............................. 2005-087580

(51) Int. Cl.
*H02H 9/00* (2006.01)
*H01L 21/302* (2006.01)
*G06F 19/00* (2006.01)

(52) U.S. Cl. .................. 361/56; 438/710; 700/109; 700/121

(58) Field of Classification Search ............... 361/56; 700/109, 121; 438/710
See application file for complete search history.

(56) References Cited

U.S. PATENT DOCUMENTS

| 6,333,272 B1 * | 12/2001 | McMillin et al. ............ 438/710 |
| 6,449,524 B1 * | 9/2002 | Miller et al. ................ 700/121 |
| 6,646,857 B2 * | 11/2003 | Anderson et al. ............ 361/234 |
| 6,813,534 B2 * | 11/2004 | Sui et al. ..................... 700/121 |
| 6,898,558 B2 * | 5/2005 | Klekotka ..................... 702/188 |
| 6,920,369 B2 * | 7/2005 | Ueno et al. .................. 700/121 |
| 7,010,374 B2 * | 3/2006 | Tanaka et al. ............... 700/109 |
| 7,029,594 B2 * | 4/2006 | Yasui et al. ................... 216/61 |
| 2002/0055801 A1 * | 5/2002 | Reiss et al. ................. 700/111 |
| 2004/0025790 A1 * | 2/2004 | Ben ............................ 118/724 |
| 2005/0241770 A1 * | 11/2005 | Moriya et al. .......... 156/345.51 |
| 2006/0149403 A1 * | 7/2006 | Shimizu et al. ............... 700/96 |

FOREIGN PATENT DOCUMENTS

| JP | 62-238621 | * 10/1987 |
| JP | 09-064021 | 3/1997 |
| JP | 11-274141 | 10/1999 |

* cited by examiner

*Primary Examiner*—Stephen W Jackson
*Assistant Examiner*—Lucy Thomas
(74) *Attorney, Agent, or Firm*—Oblon, Spivak, McClelland, Maier & Neustadt, P.C.

(57) ABSTRACT

The present invention provides a substrate processing apparatus that executes electrical discharge processing before detaching a substrate held onto an electrostatic chuck of a lower electrode constituting a stage and undergoing a specific type of processing from the electrostatic chuck. Before electrically discharging the substrate, a decision is made as to whether or not the specific type of processing on the substrate has ended normally, and electrical discharge conditions are set based upon regular electrical discharge condition information stored at a regular electrical discharge condition information storage means if the substrate processing is judged to have ended normally, whereas electrical discharge conditions are set based upon non-regular electrical discharge condition information stored at a non-regular electrical discharge condition information storage means if the substrate processing is judged not to have ended normally. Then, under the electrical discharge conditions having been set, electrical discharge processing is executed on the substrate.

27 Claims, 9 Drawing Sheets

FIG.3

| WAFER PROCESSING CONDITION INFORMATION | 282 |
|---|---|
| PRESSURE (mTorr) | 15 |
| FIRST HIGH FREQUENCY POWER (W) | 1550 |
| SECOND HIGH FREQUENCY POWER (W) | 2170 |
| DISTANCE BETWEEN ELECTRODES (mm) | 25 |
| PROCESSING GAS (sccm) | $C_5F_8/Ar/O_2$ =15/400/24 |
| HEAT TRANSFERRED GAS PRESSURE CENTER/EDGE (T) | 5/25 |
| TEMPERATURE (°C) | 20 |
| ⋮ | ⋮ |

FIG.4

| REGULAR ELECTRICAL DISCHARGE CONDITION INFORMATION | 284 |
|---|---|
| VOLTAGE APPLIED TO A ELECTROSTATIC CHUCK (V) | −800 |
| GAS FLOW RATE (sccm) | 600 |
| PROCESSING CHAMBER INTERNAL PRESSURE (mTorr) | 100 |
| ⋮ | ⋮ |

FIG.5

| | ALLOWABLE LIMIT CONDITION INFORMATION | | | | ELECTRICAL DISCHARGE PROCESSING STATUS |
|---|---|---|---|---|---|
| | ALLOWABLE LIMIT CONDITIONS 1 | | ALLOWABLE LIMIT CONDITIONS 2 | | NUMBER OF TIMES ALLOWABLE LIMIT CONDITIONS 1 ARE SATISFIED |
| | RANGE (%) | TIME (sec) | RANGE (%) | TIME (sec) | |
| VOLTAGE APPLIED TO ELECTROSTATIC CHUCK | ±5 | 2 | ±10 | 5 | 0 |
| GAS FLOW RATE | ±5 | 2 | ±10 | 5 | 1 |
| PROCESSING CHAMBER INTERNAL PRESSURE | ±5 | 2 | ±10 | 5 | 0 |
| ... | ... | ... | ... | ... | ... |

| NONREGULAR ELECTRICAL DISCHARGE CONDITION INFORMATION | 294 |
|---|---|
| VOLTAGE APPLIED TO ELECTROSTATIC CHUCK (V) | −1000 |
| DURATION OF VOLTAGE APPLICATION (sec) | 120 |
| PROCESSING CHAMBER INTERNAL PRESSURE (mTorr) | 300 |
| DURATION OF PRESSURE ADJUSTMENT etc., (sec) | 120 |
| GAS FLOW RATE AT GAS LINE A (sccm) | 800 |
| GAS FLOW RATE AT GAS LINE B (sccm) | 200 |
| GAS FLOW RATE AT GAS LINE C (sccm) | 0 |
| ⋮ | ⋮ |

METHOD FOR ELECTRICALLY DISCHARGING SUBSTRATE, SUBSTRATE PROCESSING APPARATUS AND PROGRAM

CROSS REFERENCE TO RELATED APPLICATIONS

This document claims priority to Japanese Patent Application No. 2005-087580, filed Mar. 25, 2005 and U.S. Provisional Application No. 60/666,715, filed Mar. 31, 2005, the entire contents of which are hereby incorporated by reference.

FIELD OF THE INVENTION

The present invention relates to a method for electrically discharging a substrate before detaching the substrate from a stage, a substrate processing apparatus and a program.

BACKGROUND OF THE INVENTION

In a substrate processing apparatus that executes a specific type of processing such as etching or film formation on a substrate which may be a semiconductor wafer or a glass substrate, the substrate having been carried into a processing chamber and placed on a stage via a transfer arm or the like undergoes processing such as etching while it is vacuum-held onto the stage. Once the processing is completed, the substrate is detached from the stage by, for instance, pushing up a lift pin disposed so as to be allowed to move up/down freely, and is carried out via the transfer arm or the like.

An electrostatic chuck that holds the substrate with an electrostatic force such as the coulomb force as a DC voltage is applied to an electrode plate embedded in, for instance, a dielectric member, is often used as a jig for holding fast the substrate onto the stage. Some electrical charge may remain in the substrate even when the voltage to the electrostatic check holding the substrate is turned off upon completion of the processing and, in such a case, the electrostatic chuck may retain the holding force. As the substrate is detached from the stage via a lift pin or the like in this state, the substrate may become cracked and thus damaged or it may become misaligned. For this reason, processing for electrically discharging the substrate is executed before detaching the substrate so as to reduce the electrostatic holding force (see, for instance, Japanese Laid Open Patent Publication No. H09-064021 and Japanese Laid Open Patent Publication No. H11-274141).

When executing such electrical discharge processing, electrical discharge conditions are set by reading out parameters indicating the electrical discharge conditions (e.g., the voltage to be applied to the electrostatic chuck, the processing chamber internal pressure and the flow rate of the gas to be drawn into the processing chamber) stored in advance together with the substrate processing conditions (processing recipe), and the electrical discharge processing is executed based upon the electrical discharge conditions thus set.

However, since the values of the individual parameters indicating the electrical discharge conditions stored in advance are set on the assumption that the substrate is to be electrically discharged upon a normal completion of the processing on the substrate, the substrate is not always electrically discharged to the full extent, depending upon the state of the substrate undergoing the electrical discharge processing.

For instance, if an abnormal condition occurs in the substrate processing apparatus while the processing on the substrate such as etching is in progress and thus the processing does not end normally, the substrate may become held onto the stage with excessive force, depending upon the cause of the abnormal condition or the length of time over which it is left untended. In such a case, the substrate may not be electrically discharged to the full extent by executing the electrical discharge processing under the electrical discharge conditions stored in advance, to result in cracking or misalignment of the substrate.

SUMMARY OF THE INVENTION

An object of the present invention, which has been completed by addressing the problem of the related art discussed above, is to provide a substrate processing apparatus, a method for electrically discharging a substrate and a program, with which a substrate can be electrically discharged to the full extent even when the processing on the substrate has not ended normally, as well as when the substrate processing has ended normally.

The object described above is achieved in an aspect of the present invention by providing a method for electrically discharging a substrate held onto a stage disposed inside a processing chamber and undergoing a specific type of processing before detaching the substrate from the stage, comprising an electrical discharge condition setting step in which a decision is made as to whether or not the specific type of processing on the substrate has ended normally, electrical discharge conditions are set based upon regular electrical discharge condition information stored at a regular electrical discharge condition information storage means if the processing is determined to have ended normally and electrical discharge conditions are set based upon non-regular electrical discharge condition information stored at a non-regular electrical discharge condition information storage means if the processing is determined not to have ended normally, before electrically discharging the substrate and an electrical discharge processing execution step in which electrical discharge processing is executed on the substrate based upon the electrical discharge conditions having been set in the electrical discharge condition setting step.

The object described above is also achieved in another aspect of the present invention by providing a substrate processing apparatus that electrically discharges a substrate held onto a stage disposed inside a processing chamber and undergoing a specific type of processing before detaching the substrate from the stage, comprising a regular electrical discharge condition information storage means for storing regular electrical discharge condition information, a non-regular electrical discharge condition information storage means for storing non-regular electrical discharge condition information, an electrical discharge condition setting means for making a decision as to whether or not the specific processing on the substrate has ended normally, setting electrical discharge conditions based upon the regular electrical discharge condition information at the regular discharge condition information storage means if the processing is determined to have ended normally and setting electrical discharge conditions based upon the non-regular electrical discharge condition information at the non-regular electrical discharge condition information storage means if the processing is determined not to have ended normally, before electrically discharging the substrate, and an electrical discharge processing execution means for executing electrical discharge processing on the substrate based upon the electrical discharge conditions having been set by the electrical discharge condition setting means.

The object described above is achieved in yet another aspect of the present invention by providing a program enabling execution of electrical discharge processing on a substrate held onto a stage disposed inside a processing chamber and undergoing a specific type of processing before detaching the substrate from the stage, that enables a computer to execute an electrical discharge condition setting procedure in which a decision is made as to whether or not the specific type of processing on the substrate has ended normally, electrical discharge conditions are set based upon regular electrical discharge condition information stored at a regular electrical discharge condition information storage means if the processing is determined to have ended normally and electrical discharge conditions are set based upon non-regular electrical discharge condition information stored at a non-regular electrical discharge condition information storage means if the processing is determined not to have ended normally, before electrically discharging the substrate and an electrical discharge processing execution procedure in which electrical discharge processing is executed on the substrate based upon the electrical discharge conditions having been set.

With the apparatus, the method and the program according to the present invention described above, the electrical discharge processing is executed based upon the regular electrical discharge conditions if the specific type of processing on the substrate has ended normally, whereas the electrical discharge processing is executed based upon the non-regular electrical discharge conditions different from the regular electrical discharge conditions if the specific type of processing on the substrate has not ended normally. Thus, the substrate can be electrically discharged to the full extent even when the specific type of processing has not ended normally as well as when the processing has ended normally. This, in turn, makes it possible to prevent cracking or misalignment of the substrate with a high degree of reliability.

In an application of the apparatus, the method or the program, if the processing on the substrate is determined not to have ended normally, a decision may be made as to whether or not the operation has shifted to maintenance during the electrical discharge condition setting process. In this case, if the operation is determined to have shifted to maintenance, the electrical discharge conditions may be set based upon the non-regular electrical discharge condition information stored at an apparatus parameter storage means upon returning from the maintenance operation as well. Since the electrical discharge processing is executed based upon the non-regular electrical discharge conditions as a result, the substrate can be electrically discharged to the full extent even if the substrate has come to be held with an excessive force before the operation makes a return from the maintenance mode.

The electrical discharge processing execution means used in the apparatus, the method or the program described above may detect the electrical discharge processing status while executing the electrical discharge processing, compare a detection value with an allowable limit condition, judge the electrical discharge processing to be in an error state if the detection value indicating the electrical discharge processing status satisfies the allowable limit condition, halt the electrical discharge processing and retry the electrical discharge processing based upon electrical discharge conditions reset in correspondence to the non-regular electrical discharge conditions stored at the non-regular electrical discharge condition information storage means. In this case, even when the substrate has not been electrically discharged to the full extent due to an error in the electrical discharge processing, the electrical discharge processing is retried based upon the non-regular electrical discharge conditions, thereby making it possible to electrically discharge the substrate to the full extent.

In an application of the apparatus, the method or the program, the allowable limit condition may be set in two stages, as an error condition under which an error is judged to have occurred in the electrical discharge processing and a warning condition which is not as serious as the error condition. In this case, if the detection value indicating the electrical discharge processing status obtained while executing the electrical discharge processing satisfies the error condition, the electrical discharge processing may be judged to be in an error state and the electrical discharge processing may be halted, whereas if the detection value indicating the electrical discharge processing status satisfies the warning condition, the electrical discharge processing may be judged to be in a state that warrants a warning and warning processing may be executed. Since the operator can be warned through the warning processing or the like whenever the electrical discharge processing enters a state that warrants a warning, the operator is able to foresee any likelihood of the electrical discharge processing entering an error state.

In an application of the apparatus, the method or the program, the operator may be prompted to indicate whether or not to retry the electrical discharge processing upon completion of the electrical discharge processing on the substrate, and if the retry of the electrical discharge processing is indicated, the electrical discharge conditions may be set based upon the non-regular electrical discharge condition information at the non-regular electrical discharge condition information storage means. As the electrical discharge processing can be retried in a manner befitting the state of the substrate, the substrate can be electrically discharged with a higher level of reliability in this application.

In an application of the apparatus, the method or the program, the non-regular electrical discharge condition information may be edited via, for instance, an input means. In such a case, the operator is able to set the electrical discharge conditions in correspondence to the state of the substrate with the timing with which the electrical discharge processing is executed based upon the non-regular electrical discharge condition information, and, as a result, the substrate can be electrically discharged to the full extent with a high degree of efficiency.

In an application of the apparatus, the method or the program, the number of editable parameters indicating electrical discharge conditions included in the non-regular electrical discharge condition information may be greater than the number of parameters included in the regular electrical discharge condition information, so as to allow finer details to be set for the electrical discharge conditions based upon the non-regular electrical discharge condition information than the electrical discharge conditions set based upon the regular electrical discharge condition information 284, since the electrical discharge processing may be executed based upon the non-regular electrical discharge information following some type of error. Since finer details can be set as the electrical discharge conditions depending upon the state of the substrate undergoing the electrical discharge processing, the substrate can be electrically discharged to the full extent more reliably in this application.

In an application of the apparatus, the method or the program, the electrical discharge processing executed based upon the electrical discharge conditions set based upon the non-regular electrical discharge condition information may include processing for evacuating the space between the rear surface of the substrate and the stage, so as to prevent the substrate from popping up while it is being detached from the stage.

In an application of the apparatus, the method or the program, the electrical discharge processing may include processing for repeatedly reversing the polarity of the voltage applied to the electrostatic holding means for electrostatically holding the substrate onto the stage disposed inside the processing chamber, so as to ensure that the substrate is electrically discharged reliably.

In an application of the apparatus, the method or the program, the non-regular electrical discharge condition information may contain at least, parameters indicating the voltage to be applied to the electrostatic holding means, the processing chamber internal pressure and the gas flow rates at a plurality of gas lines through which the processing gas is supplied into the processing chamber. In this case, the non-regular electrical charge condition information can be edited so that even when an abnormal condition occurs at a given gas line while executing the electrical discharge processing and the processing gas can no longer be supplied through the gas line at a specific flow rate required for the electrical discharge processing, the sum of the gas flow rates representing the combined processing gas supply through the remaining gas lines achieves the specific flow rate required in the electrical discharge processing.

BRIEF DESCRIPTION OF THE DRAWINGS

FIG. 3 presents a specific example of the wafer processing condition information data table in FIG. 2;

FIG. 4 presents a specific example of the regular electrical discharge condition information data table in FIG. 2;

FIG. 5 presents a specific example of the allowable limit condition information data table in FIG. 2;

FIG. 6 presents a specific example of the non-regular electrical discharge condition information data table in FIG. 2;

DETAILED DESCRIPTION OF THE PREFERRED EMBODIMENT

Figure 1:
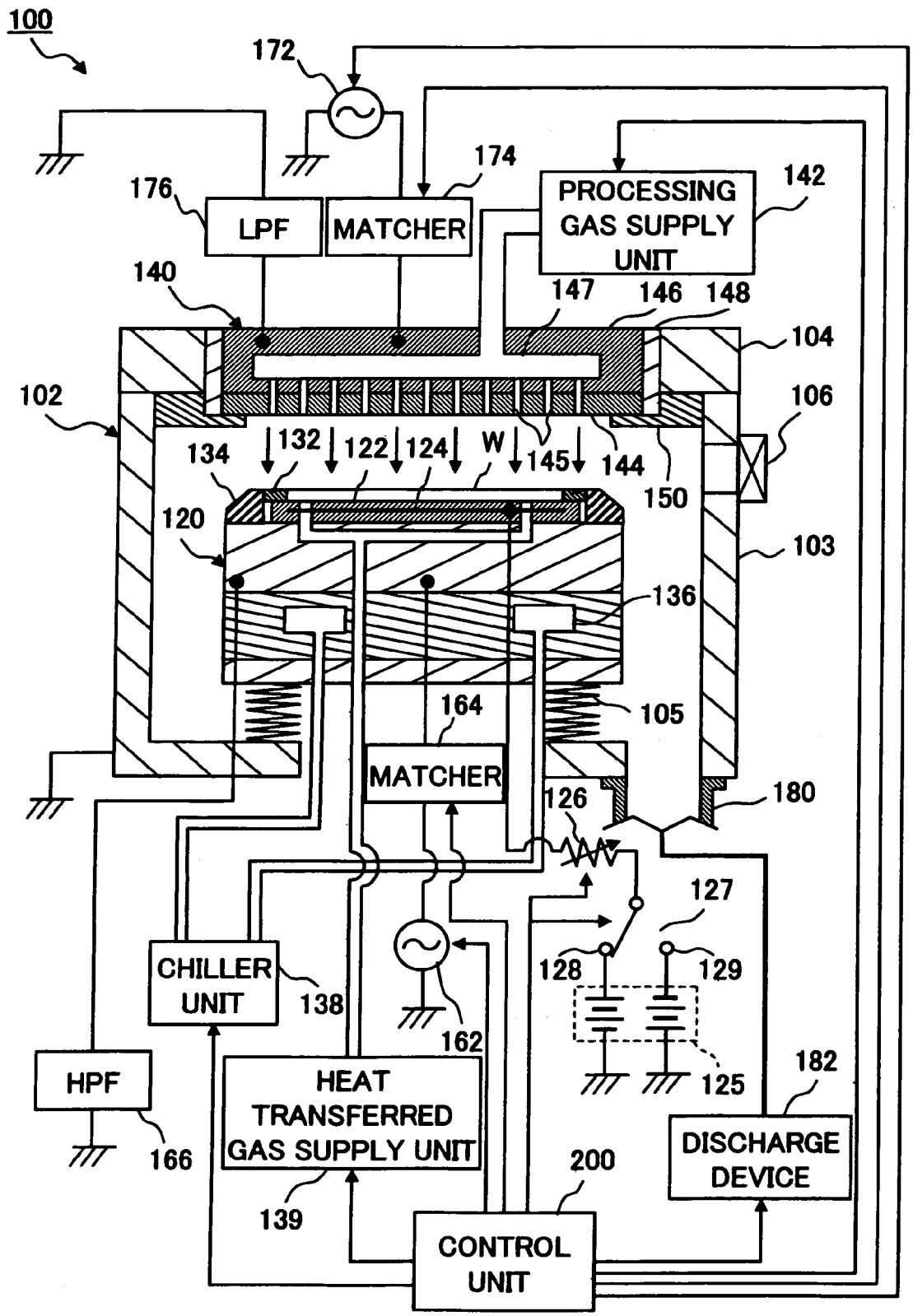
FIG. 1 is a sectional view presenting a structural example that may be adopted in the substrate processing apparatus achieved in an embodiment of the present invention.

The following is a detailed explanation of the preferred embodiment of the present invention, given in reference to the attached drawings. It is to be noted that in the specification and the drawings, the same reference numerals are assigned to components having substantially identical functions and structural features to preclude the necessity for a repeated explanation thereof.

(Structural Example of Substrate Processing Apparatus)

First, an example of a structure that may be adopted in the substrate processing apparatus according to the present invention is explained in reference to a drawing. FIG. 1 is a sectional view presenting a structural example that may be adopted in the substrate processing apparatus achieved in the embodiment. A substrate processing apparatus 100 is a plasma processing apparatus that executes processing such as etching on a processing target substrate.

As shown in FIG. 1, the substrate processing apparatus 100 includes a processing chamber 102 constituted of an electrically conductive material such as aluminum. The processing chamber 102 is constituted with a processing container that includes a container main body 103 with an open top and a cover (lid portion) 104 that closes off the opening at the container main body 103. The cover 104 is detachably mounted at the container main body 103 via fastening members such as bolts by assuring a high level of airtightness. In addition, a seal member (not shown) such as an O-ring, is inserted between the cover 104 and the container main body 103. As a result, an even higher level of airtightness is assured in the space between the cover 104 and the container main body 103. It is to be noted that the processing chamber 102 is grounded for safety purposes.

Inside the processing chamber 102, a disk-shaped lower electrode (susceptor) 102 that also functions as a stage on which a substrate to undergo processing, such as a semiconductor wafer (hereafter may be simply referred to as a "wafer") W, is placed and an upper electrode 140 that is set so as to face opposite the lower electrode 120 and functions as a shower head through which a processing gas, a purge gas or the like is drawn into the processing chamber, are disposed.

A first high-frequency power source 162 is connected to the lower electrode 120 via a matcher 164, whereas a second high-frequency power source 172 capable of providing power with a higher frequency than that provided by the first high-frequency power source 162 is connected to the upper electrode 140 via a matcher 174. In addition, a high pass filter (HPF) 166 for filtering a high frequency current having flowed into the lower electrode 120 from the second high-frequency power source 172 is connected to the lower electrode 120, whereas a low pass filter (LPF) 176 for filtering a high frequency current having flowed into the upper electrode 140 from the first high frequency source 162 is connected to the upper electrode 140.

A processing gas supply unit 142 that supplies a gas needed to execute processing inside the processing chamber 102 is connected to the upper electrode 140 via a gas supply pipe. The processing gas supply unit 142 is constituted with a gas supply source, from which a processing gas, a purge gas or the like needed when processing a wafer inside the processing chamber 102 or when cleaning the inside of the processing chamber 102 are supplied, and a plurality of gas lines each equipped with a valve and a mass flow controller for controlling the gas intake from the gas supply source.

It is to be noted that the processing gas supply unit 142 includes a plurality of gas lines, any of which can be selected freely based upon, for instance, a control signal provided by a control unit 200. Different types of processing gases may be supplied through different gas lines, or a single type of processing gas may be supplied through the plurality of gas lines. This structure allows a given type of processing gas to be supplied through another gas line if an error occurs at one of the gas lines. In addition, since a processing gas can be supplied through a plurality of gas lines with the combined flow rate exceeding the level of the flow rate that can possibly be achieved through a single gas line, the processing gas can be supplied at the required flow rate that is high enough for the processing.

In addition, a discharge port 180 is formed at the bottom surface of the processing chamber 102. A discharge device 182 that discharges the gas inside the processing chamber 102 is connected to the discharge port 180 via a discharge pipe. The discharge device 182, which may include, for instance, a vacuum pump, is capable of depressurizing the internal space at the processing chamber 102 until a predetermined level of vacuum is achieved therein.

An electrostatic chuck 122 that electrostatically holds a wafer W is disposed at the lower electrode 120. The electrostatic chuck 122 may be formed by, for instance, enclosing an electrostatic chuck electrode 124 constituted with an electrically conductive film within an insulating film. A DC power source 125 that can be switched from a positive voltage application to a negative voltage application and vice versa is electrically connected to the electrostatic chuck electrode 124 via a variable resistor 126 and a switch 127.

As the switch 127 connected with a terminal 128 closes and a positive voltage is applied from the DC power source 125 to the electrostatic chuck 122 structured as described above, the wafer W is electrostatically held onto the electrostatic chuck 122 by coulomb force. As the switch 127 connected with a terminal 129 closes and a negative voltage is applied from the DC power source 125, the substrate can be electrically discharged through the application of the voltage, the polarity of which is the opposite of the polarity of the voltage applied to electrostatically hold the substrate. In addition, by adjusting the voltage applied from the DC power source 125 via the variable resistor 126, the level of the force holding the wafer W can be adjusted. It is to be noted that instead of applying a positive voltage to electrostatically hold the substrate and applying a negative voltage to electrically discharge the substrate as described above, voltages with reverse polarities may be applied to hold and discharge the substrate, depending upon the structure adopted in the electrostatic check 122.

A detaching means (not shown) for separating the wafer W from the upper surface of the electrostatic chuck 122 is disposed at the lower electrode 120. The detaching means may be constituted by, for instance, mounting at an elevating member a plurality of (e.g., 4) lift pins (may be instead referred to as lift pins or support pins) extending along the vertical direction at the lower electrode 120, which are allowed to move through the upper surface of the electrostatic chuck 122. These lift pins are allowed to move up/down via the elevating member by a drive mechanism constituted of, for instance, an air cylinder, a ball screw mechanism or the like. As the lift pins move up, the tips of the lift pins project out above the front surface of the electrostatic check 122 via holes formed at the lower electrode, and thus, the wafer W becomes lifted off the electrostatic chuck 122.

A focus ring 132 is disposed at the edge around the upper surface of the electrostatic check 122 so as to surround the periphery of the wafer W. In addition, at the edge of the upper surface of the lower electrode, a cover ring 134 is disposed so as to surround the electrostatic chuck 122 and the focus ring 132. Plasma is directed onto the wafer W by the focus ring 132 and the cover ring 134. It is to be noted that the focus ring 132 and the cover ring 134 do not need to be constituted as separate members, and may be formed as an integrated unit.

Inside the lower electrode 120, a cooling mechanism is disposed. This cooling mechanism adopts a structure that allows a coolant (e.g., cooling water) at a predetermined temperature from a chiller unit 138 to be supplied and circulated via piping to a coolant chamber 136 ranging along the circumferential direction inside the lower electrode 120. The temperature at which the wafer W on the electrostatic chuck 122 is processed can be controlled in correspondence to the coolant temperature.

A heat transfer gas (a cooling gas, a back gas) such as He gas from a heat transfer gas supply unit 139 is supplied via a gas supply line into the space between the upper surface of the electrostatic chuck 122 and the rear surface of the wafer W. The heat transfer gas thus supplied promotes the process of heat transmission between the lower electrode 120 and the wafer W. The heat transfer gas supply unit 139 is capable of evacuating the space between the upper surface of the electrostatic chuck 122 and the rear surface of the wafer W. As a result, the pressure in the space between the upper surface of the electrostatic chuck 122 and the rear surface of the wafer W can be adjusted.

A bellows 105 constituted of, for instance, aluminum is disposed between the lower surface of the lower electrode 120 and the bottom surface of the processing chamber 102. An elevating mechanism (not shown) is disposed at the lower electrode 120, and as the lower electrode 120 is made to move up/down via the elevating mechanism, the distance between the lower electrode and the upper electrode 140 is adjusted to an optimal value in correspondence to the type of processing executed on the wafer W. In addition, a gate valve 106 that opens/closes a wafer transfer port is mounted at a side wall of the processing chamber.

The upper electrode 140, which also functions as a shower head, includes an electrode plate 144 constituting the lower surface thereof with numerous gas delivery holes 145 formed thereat and an electrode support member 146 that detachably supports the electrode plate 144. The electrode plate 144 may be constituted of, for instance, a silicon material, whereas the electrode support member 146 may be constituted of, for instance, an aluminum material. A buffer chamber 147 is formed inside the electrode support member 146 and the processing gas supply unit 142 mentioned earlier is connected to a gas intake port of the buffer chamber 147 via a gas intake pipe.

An insulating member 148 is disposed at the upper electrode 140 so as to surround its periphery and thus, the upper electrode is insulated from the processing chamber 102. The lower surface of the insulating member 148 and the lower surface of the electrode plate 144 are set on a single plane and a shield ring 150 is mounted at the edge around the lower surfaces of the insulating member 148 and the electrode plate 144. The shield ring 150 may be formed by using an inorganic oxide such as quartz or alumina. It is to be noted that the shield ring 150 does not need to be constituted as a member independent of the insulating member 148, and the shield ring may be constituted as an integrated part of the insulating member, instead.

The substrate processing apparatus 100 includes the control unit 200 that controls the various units thereof. The first and second high-frequency power sources 162 and 172, the matchers 164 and 174, the processing gas supply unit 142, the discharge device 182, the switch 127 and the variable resistor 126 for the electrostatic check 122, the chiller unit 138, the heat transfer gas supply unit 139 and the like are connected to the control unit 200.

In addition, the substrate processing apparatus 100 includes various sensors (not shown). These sensors include electric parameter sensors provided to measure the voltages applied to the upper electrode 140 and the lower electrode 120 and the voltage applied to the electrostatic chuck 122, gas flow rate sensors provided to detect the flow rate of the processing gas supplied by the processing gas supply unit 142 and the flow rate of the heat transfer gas supplied by the heat transfer gas supply unit 139 and temperature sensors provided to detect the temperatures at the upper electrode 140, the lower electrode 120 and the like. The sensors also include a plasma emission spectrometer (not shown) mounted via a transparent window disposed at a side wall of the processing chamber 102. The plasma emission spectrometer is used to detect a change in the plasma state by spatially metering plasma with a predetermined wavelength and detect an etching endpoint based upon the change in the intensity of the plasma with the predetermined wavelength. These sensors are all connected with the control unit 200.

The control unit 200 detects the status of the processing, such as etching, executed on the wafer (wafer processing) and the electrical discharge processing status to be detailed later via the various sensors including the electric parameter sensors, the gas flow rate sensors, the temperature sensors and the plasma emission spectrometer described above. Based upon the detection values thus obtained, the control unit 200 executes the processing by controlling the individual units such as the processing gas supply unit 142, the discharge device 182 and the heat transfer gas supply unit 139. Based upon the detection values provided by the various sensors, it makes decisions as to whether or not the wafer processing, the electrical discharge processing to be detailed later and the like are being executed in normal conditions and engages a warning means 260 such as an alarm to alert the operator if an abnormal condition such as a failure in the substrate processing apparatus 100 or a process error is detected (interlock processing).

(Structural Example of Control Unit)

Figure 2:
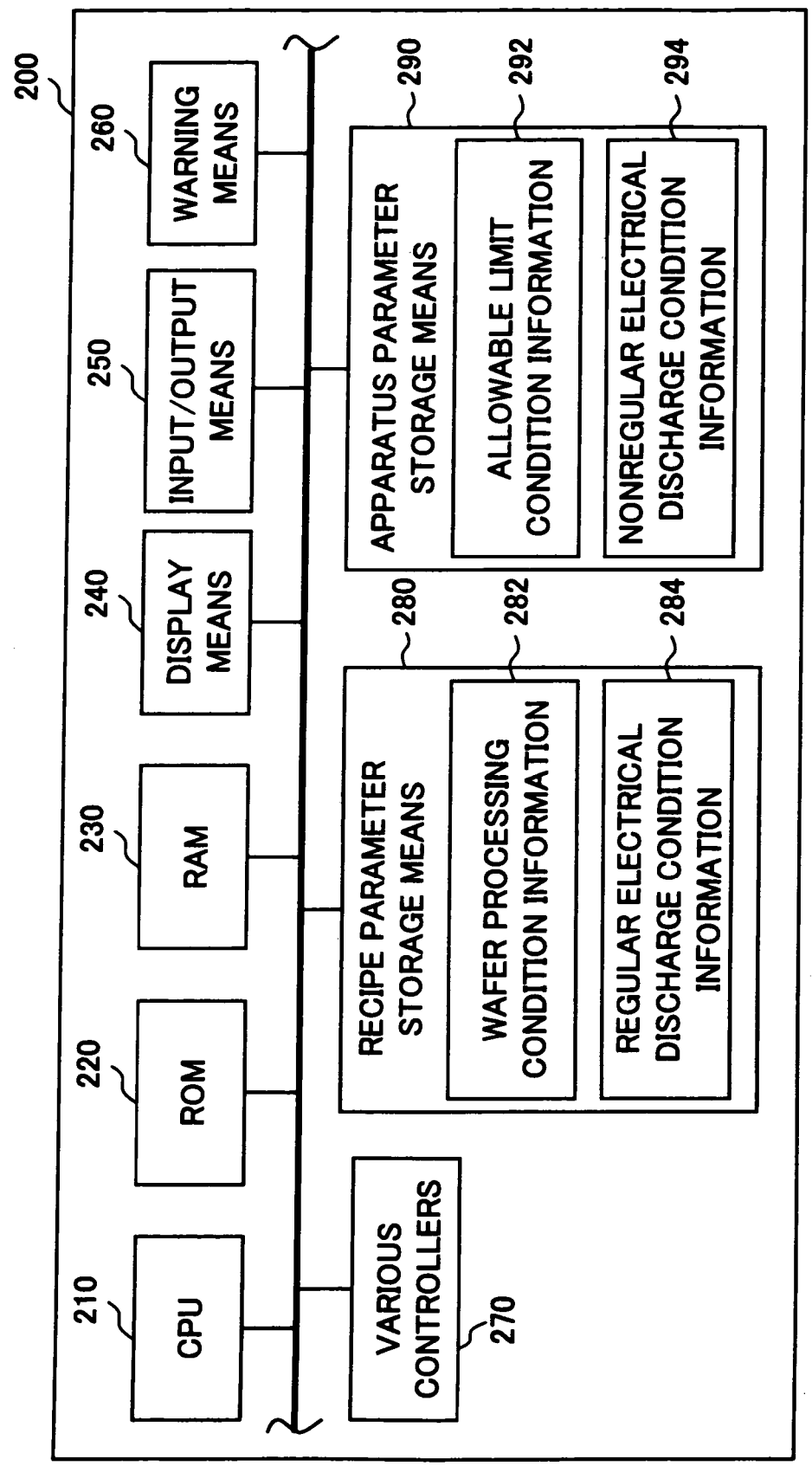
FIG. 2 is a block diagram showing a structural example that may be adopted in the control unit in FIG. 1.

Next, a structural example that may be adopted in the control unit described above is explained in reference to FIG. 2. As shown in FIG. 2, the control unit 200 comprises a CPU (central processing unit) 210 constituting the control unit main body, a ROM (read only memory) 220 having stored therein program data used by the CPU 210 to control the various units (e.g., program data that enable execution of a specific type of processing on wafers W and electrical discharge processing on the wafers W) and a RAM (random access memory) 230 that contains a memory area used for various types of data processing executed by the CPU 210.

The control unit 200 further comprises a display means 240 constituted with, for instance, a liquid crystal display at which operation screens, selection screens and the like are displayed, an input/output means 250 that includes an input means, which allows the operator to input various types of data by operating, for instance, a keyboard or a touch panel and an output means that allows various types of data to be output to a printer, an external storage device or the like in response to an operation by the user, the warning means 260 constituted with an alarm such as a buzzer, various controllers 270 that control the individual units (e.g., the processing gas supply unit 142, the heat transfer gas supply unit 139, the switch 127 for the electrostatic chuck 122) constituting the substrate processing apparatus 100, a recipe parameter storage means 280 representing an example of the regular electrical discharge condition information storage means and an apparatus parameter storage means 290 representing an example of non-regular electrical discharge condition information storage means.

The CPU 210, the ROM 220, the RAM 230, the display means 240, the input/output means 250, the warning means 260, the various controllers 270, the recipe parameter storage means 280 and the apparatus parameter storage means 290 are electrically connected with one another through a bus line such as a control bus, a system bus or a data bus.

The various controllers 270 include controllers used to control, for instance, the first and second high-frequency power sources 162 and 172, the matchers 164 and 174, the processing gas supply unit 142, the discharge device 182, the switch 127 and the variable resistor 126 for the electrostatic chuck 122, the chiller unit 138 and the heat transfer gas supply unit 139.

While information to be referenced when the processing on wafers W and the like are automatically executed in the substrate processing apparatus 100 is mainly stored at the recipe parameter storage means 280, information to be referenced when the processing by the substrate processing apparatus 100 is halted and various settings are selected and maintenance processing and the like are executed for the substrate processing apparatus 100 by the operator is mainly stored in the apparatus parameter storage means 290.

In the embodiment, regular electrical discharge condition information 284 to be referenced when a specific type of processing (hereafter may also be referred to as "wafer processing") such as etching continuously executed on wafers W has ended normally, is stored at the recipe parameter storage means 280, whereas non-regular electrical discharge condition information 294 to be used if the wafer processing has not ended normally is stored at the apparatus parameter storage means 290. Thus, as long as the wafer processing ends normally, the electrical discharge processing can be automatically executed upon the wafer processing completion and the throughput of the processing can be improved as a result. If, on the other hand, any abnormal condition occurs and the wafer processing does not end normally, e.g., if it is necessary to remove the wafer W undergoing the processing by halting the wafer processing, optimal electrical discharge conditions can be set in correspondence to the state of the wafer W which reflects the cause of the abnormal condition and the length of time over which it has been left untended, and thus, the wafer W can be electrically discharged to the full extent.

The following is an explanation of the contents of the information stored at the recipe parameter storage means 280 and the apparatus parameter storage means 290. At the recipe parameter storage means 280, wafer processing condition (processing recipe) information 282 and regular electrical discharge condition (electrical discharge recipe) information 284 are stored. The wafer processing condition information 282 indicates conditions under which the individual units constituting the substrate processing apparatus 100 should be controlled when executing the wafer processing in the processing chamber 102. The wafer processing condition information 282 includes a plurality of parameters such as the processing chamber internal pressure, types and flow rates of gases constituting the processing gas, the high frequency voltages applied to the upper electrode and the lower electrode, as shown in FIG. 3.

The regular electrical discharge condition information 284 indicates conditions under which the individual units constituting the substrate processing apparatus 100 should be controlled during the electrical discharge processing executed upon a normal completion of the wafer processing executed based upon the wafer processing condition information 282. Accordingly, the values of the various parameters in the regular electrical discharge condition information 284 need to be set simply by ensuring that the wafer W having undergone the wafer processing which has ended normally can be electrically discharged to the full extent. The regular electrical discharge condition information 284 includes a plurality of parameters such as the voltage applied to the electrostatic chuck, the processing gas flow rate and the processing chamber internal pressure, as shown in FIG. 4. The polarity of the voltage applied to the electrostatic chuck 122 is the opposite of the polarity of the voltage applied to electrostatically hold the substrate. The processing gas flow rate refers to the flow rate of the processing gas, such as $N_2$ gas, supplied from the processing gas supply unit 142. The processing chamber internal pressure, which is the pressure inside the processing chamber 102, can be adjusted by controlling the quantities of the processing gas drawn into and discharged from the processing chamber 102.

It is to be noted that the various parameters indicating the electrical discharge conditions, which are included in the regular electrical discharge condition information 284, may be editable parameters that can be edited through specific operations at the input/output means 250 by the operator, since the electrical discharge conditions may need to be altered in accordance to the wafer processing conditions and the like having been adjusted prior to the wafer processing execution.

At the apparatus parameter storage means 290, electrical discharge processing allowable limit condition information 292 and the non-regular electrical discharge condition (electrical discharge recipe) information 294 are stored. As the electrical discharge processing allowable limit condition information 292, allowable limit conditions used as criteria when checking whether or not the electrical discharge processing in progress is being executed normally are stored as shown in FIG. 5.

The allowable limit conditions can be set over a plurality of stages, in correspondence to all of or some of the parameters constituting the electrical discharge conditions. In the example presented in FIG. 5, the allowable limit conditions are set in two stages, i.e., allowable limit conditions 1 and allowable limit conditions 2, in the allowable limit condition information 292, in correspondence to the individual parameters including the voltage applied to the electrostatic chuck, the gas flow rate and the processing chamber internal pressure. Any values may be set as these allowable limit conditions via the input/output means 250.

The values of the electrical discharge condition parameters constituting the allowable limit conditions 2 are selected so as to indicate an abnormal state in which the detection value provided by any of the sensors deviates too far from the corresponding electrical discharge condition setting to allow the continuation of the electrical discharge processing. The values of the electrical discharge condition parameters constituting the allowable limit conditions 1, which are less rigorous than the allowable limit conditions 2, are selected so as to indicate a warning state in which the detection value provided by any of the sensors deviates from the corresponding parameter setting value by a certain extent but the electrical discharge processing can still be executed.

While the allowable limit conditions may be set only at one stage, i.e., while the allowable limit conditions 2 indicating an abnormal state occurring in the electrical discharge condition may be set, there is an advantage in setting them over two stages as described above. Namely, since the electrical discharge processing state never deteriorates to an abnormal condition corresponding to the allowable limit conditions 2 without first entering a warning state corresponding to the allowable limit conditions 1, warning processing or the like can be executed as soon as the electrical discharge processing enters a warning state to notify the operator that the electrical discharge processing is in a warning state and thus, the operator is forewarned of the likelihood that the electrical discharge processing will enter an abnormal condition.

In addition, depending upon the state of the substrate processing apparatus 100, the surrounding environment and the like during the electrical discharge processing, the detection values provided by the individual sensors, which correspond to the electrical discharge condition parameters, may fluctuate. This means that a detection value may satisfy the corresponding allowable limit condition temporarily but may immediately go back into the predetermined range, and, as a result, the electrical discharge processing itself may be executed continuously with no problem. Accordingly, the allowable limit conditions in FIG. 5 include ranges over which the detection values may deviate from the corresponding electrical discharge condition parameter value settings (e.g., the ratios to the individual parameter value settings) in correspondence to the individual allowable limit conditions 1 and 2 and also include the length of time over which each detection value need to remain outside the corresponding range to constitute an abnormal state or a warning state. As a result, even if the detection value corresponding to a given parameter temporarily moves outside the allowable limit condition, the electrical discharge processing is not judged to be in an abnormal condition unless the value remains outside the range over a length of time corresponding to the time duration setting. Thus, the electrical discharge processing is judged to be in an abnormal condition only if a truly abnormal condition occurs during the electrical discharge processing.

It is to be noted that while an explanation is given above in reference to the embodiment in which the allowable limit condition information 292 is used in the interlock processing executed as part of the electrical discharge processing, allowable limit condition information to be used in interlock processing executed as part of another specific type of processing such as etching on wafers W, may be generated by adopting a structure similar to that of the allowable limit condition information 292 and stored at, for instance, the apparatus parameter storage means. In such a case, a decision as to whether or not the processing on the wafers W is executed normally or the like can be made in a manner similar to that with which the decision with regard to the electrical discharge processing is made.

The non-regular electrical discharge condition information 294 indicates conditions under which the various units constituting the substrate processing apparatus 100 should be controlled during the electrical discharge processing executed if the wafer processing executed based upon the wafer processing condition information 282 has not ended normally. The wafer processing does not end normally if some type of abnormal condition occurs, halting the wafer processing in progress as described above or when the operator stops the wafer processing in progress regardless of whether or not an abnormal condition has occurred.

The individual parameters of the electrical discharge conditions included in the non-regular electrical discharge condition information 294 can be edited by the operator by, for instance, operating the input/output means 250. Since the electrical discharge conditions can be set by the operator based upon the specific state of the wafer W with the timing with which the electrical discharge processing is executed based upon the non-regular electrical discharge condition information 294, the wafer W can be electrically discharged to a sufficient extent with efficiency.

The number of editable parameters indicating electrical discharge conditions included in the non-regular electrical discharge condition information 294 is greater than the number of parameters included in the regular electrical discharge condition information 284. For instance, the parameters indicating the duration of the pressure adjustment in the processing chamber 102 and the duration of the voltage application to the electrostatic chuck 122 in the non-regular electrical discharge condition information 294 can be edited, so as to allow finer details to be set for the electrical discharge conditions based upon the non-regular electrical discharge condition information than the electrical discharge conditions set based upon the regular electrical discharge condition information 284, since the electrical discharge processing is often executed based upon the non-regular electrical discharge information following some type of error. Since finer details can be set as the electrical discharge conditions depending upon the state of the wafer W undergoing the electrical discharge processing, the wafer W can be electrically discharged to the full extent more reliably.

In addition, the default values of the electrical discharge condition parameters in the non-regular electrical discharge condition information 294 may be set to values equal to the values indicated in the regular electrical discharge condition information 284, since the wafer W can be electrically discharged to the full extent under conditions identical to the regular electrical discharge conditions even when the wafer processing has not ended normally, as long as the wafer state is similar to the state that would result from a normal end to the processing, e.g., as long as the wafer W has not been left untended over an extended period of time. In addition, the electrical discharge processing may be executed initially under conditions identical to the regular electrical discharge conditions and then, electrical discharge may be re-executed by editing the non-regular electrical discharge condition information 294 in reference to the wafer state.

Alternatively, the default values of the individual electrical discharge condition parameters in the non-regular electrical discharge condition information 294 may all be set to 0. In this case, the need to perform the task of adjusting the factory default settings in the non-regular electrical discharge condition information 294 for individual substrate processing apparatuses 100 is eliminated. Namely, depending upon the structure adopted in the individual substrate processing apparatuses 100 (e.g., the number of gas lines constituting the processing gas supply unit 142 and the maximum gas flow rate at which the gas can be supplied through each gas line), the parameter values that can be set for the non-regular electrical discharge condition information 294 change, and thus, if the individual parameter default values indicating the electrical discharge conditions in the non-regular electrical discharge condition information 294 are not set to 0, it becomes necessary to adjust the factory default settings in the non-regular electrical discharge condition information 294 for each substrate processing apparatus 100. By setting the parameter default settings to 0, such a need to adjust the factory default settings in the non-regular electrical discharge condition information 294 for each substrate processing apparatus 100 is eliminated.

It is to be noted that if the default settings for the individual electrical discharge condition parameters in the non-regular electrical discharge condition information 294 are all set to 0 as described above, the non-regular electrical discharge condition information 294 needs to be edited before executing the electrical discharge processing. However, even if the electrical discharge processing is executed without editing the electrical discharge conditions indicated in the non-regular electrical discharge condition information 294, the electrical discharge processing will not be executed in a normal state if all the electrical discharge condition parameters are set to 0 and thus, the wafer W is not detached from the electrostatic chuck 122 via, for instance, lift pins under these circumstances.

In addition, while an explanation is given above in reference to the embodiment on an example in which the non-regular electrical discharge condition information 294 is stored at the apparatus parameter storage means 290, the present invention is not limited to this example and the non-regular electrical discharge condition information may instead be stored at the recipe parameter storage means 280 so as to set the electrical discharge conditions by reading out the non-regular electrical discharge condition information 294 from the recipe parameter storage means 280 for the execution of the electrical discharge processing which is to be detailed later.

The non-regular electrical discharge condition information 290 includes parameters such as the voltage applied to the electrostatic chuck, the duration of voltage application to the electrostatic chuck, the processing chamber internal pressure, the duration of pressure adjustment or the like, the gas flow rate of the processing gas at each gas line constituting the processing gas supply unit 142, as shown in FIG. 6.

It is to be noted that parameters in the non-regular electrical discharge condition information may include parameters for the gas flow rates at all the gas lines constituting the processing gas supply unit 142 at the substrate processing apparatus 100, or the flow rates at a plurality of, but not all of the gas lines in the processing gas supply unit 142 may be stored as parameters in the non-regular electrical discharge condition information. In addition, the flow rates at the gas lines through which the processing gas (e.g., N2 gas or an inert gas) needed in the electrical discharge processing is supplied alone may be set as parameters. In this case, the non-regular electrical charge condition information 294 can be edited so that even when an abnormal condition occurs at a given gas line while executing the electrical discharge processing and the processing gas can no longer be supplied through the gas line at a specific flow rate required for the electrical discharge processing, the sum of the gas flow rates representing the combined processing gas supply through the remaining gas lines achieves the specific flow rate required in the electrical discharge processing.

When wafer processing such as etching is executed in the substrate processing apparatus 100 while the control unit 200 structured as described above controls the various units thereof, a wafer W is carried into the processing chamber 102 via a transfer arm or the like, is placed onto the lower electrode 120 also functioning as the stage and is electrostatically held via the electrostatic chuck 122. Then, a specific type of processing gas is supplied into the processing chamber 102 through the processing gas supply unit 142 and also, the gas inside the processing chamber 102 is discharged by the discharge device 182, thereby achieving a predetermined degree of vacuum inside the processing chamber 102.

While sustaining the predetermined degree of vacuum, first high-frequency power at, for instance, 2 MHz, is applied from the first high-frequency power source 162 to the lower electrode 120 and also a second high-frequency power at, for instance, 60 MHz, is applied to the upper electrode 140 from the second high-frequency power source 172. The second high-frequency power applied to the upper electrode 140 raises the processing gas present between the lower electrode 120 and the upper electrode 140 to plasma, and the first high-frequency power generates a self bias potential at the lower electrode 120. As a result, it becomes possible to execute plasma processing such as reactive ion etching on the wafer W set on the lower electrode 120. The control unit 200 detects any abnormal condition occurring while the wafer processing is in progress by checking the detection values provided by the various sensors and makes a decision as to whether or not an abnormal condition has occurred (interlock processing).

If the processing on the wafer W ends normally without any abnormal condition detected, electrical discharge processing is executed for the wafer W, the wafer W is then detached from the electrostatic chuck 122 by pushing up the lift pins and the wafer W is carried out of the processing chamber 102 on the transfer arm or the like. Under these circumstances, the wafer only needs to be electrically discharged based upon electrical discharge conditions pre-set in correspondence to the state that the wafer W is assumed to be in following a normal end to the wafer processing.

If, on the other hand, the wafer processing does not end normally, the wafer W may become held with an excessive force, depending upon the cause of the abnormal condition, the length of time over which the wafer W is left untended and the like. The wafer processing is not judged to have ended normally if the wafer processing has been halted due to a failure of the substrate processing apparatus 100, a power outage, a power leak or a process error occurring during the wafer processing execution, or the substrate processing apparatus is restarted and restored to a normal state following maintenance or the like executed to eliminate the cause of the abnormal condition or the like.

Under these circumstances, a considerable length of time may elapse before the substrate processing apparatus is restored from the abnormal condition and the wafer W may be left held onto the electrostatic chuck. For these reasons, the wafer W undergoing the electrical discharge processing may be held to the electrostatic chuck with a greater force compared to the level of the force with which it would be held at a normal completion of the wafer processing. Thus, if the electrical discharge processing is executed for the wafer W under the same electrical discharge conditions as those described above, in order to detach the wafer W from the electrostatic chuck 122, the wafer W will not be electrically discharged to the full extent. Such insufficient electrical discharge may lead to cracking of the wafer W as it is separated from the electrostatic chuck 122 by pushing up the lift pins or misalignment of the wafer W being carried out on the transfer arm.

Accordingly, the non-regular electrical discharge conditions that allow the various electrical discharge condition parameters to be edited are set as well as the regular electrical discharge conditions indicating parameter values selected for electrical discharge of a wafer W resulting from a normal completion of wafer processing, the electrical discharge processing is executed based upon the regular electrical discharge conditions if the wafer processing has ended normally, and the electrical discharge processing is executed based upon the non-regular electrical discharge conditions if the wafer processing has not ended normally. This allows the wafer to be electrically discharged under electrical discharge conditions that are different from the regular electrical discharge conditions, if the wafer processing has not ended normally, and thus, the wafer W can be electrically discharged to the full extent even when the wafer processing has not ended normally. Consequently, cracking or misalignment of the wafer W can be reliably prevented.

(Specific Example of Wafer Electrical Discharge Processing)

Figure 7:
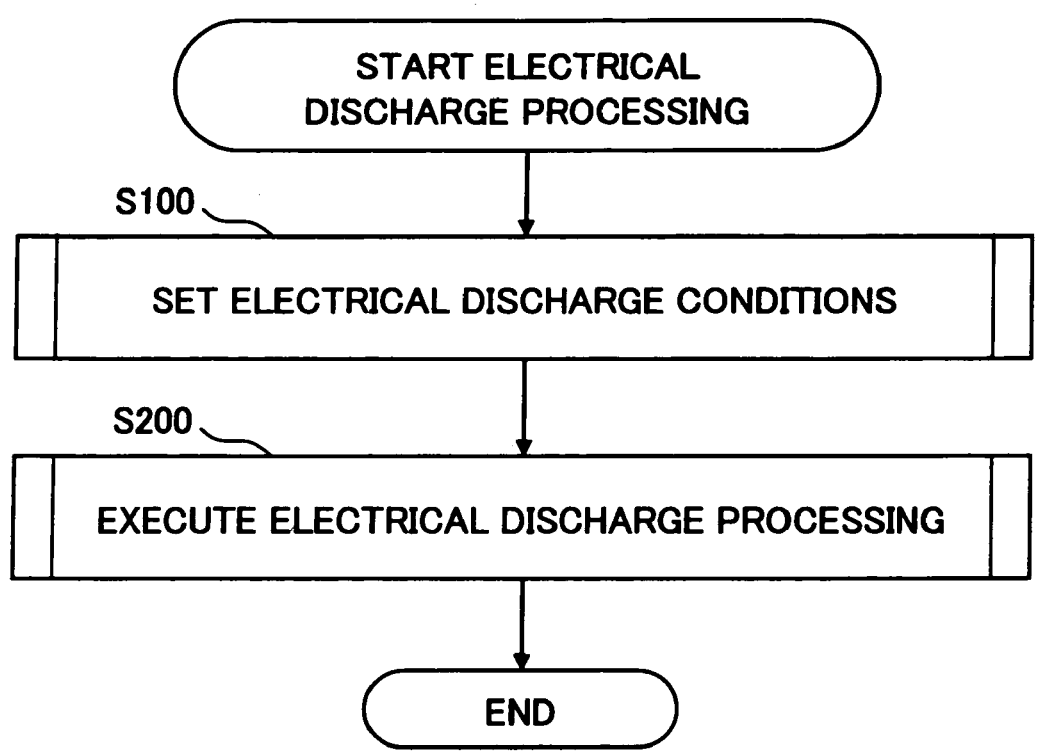
FIG. 7 presents a flowchart of a specific example of the electrical discharge processing executed in the embodiment.

A specific example of the wafer electrical discharge processing executed in the embodiment described above is now explained. FIG. 7 presents a flowchart of the specific example of the wafer electrical discharge processing. In step S100 in FIG. 7, the electrical discharge conditions are set in correspondence to the state of the wafer W (the electrical discharge condition setting means, the electrical discharge condition setting step, the electrical discharge setting step), and the electrical discharge processing is executed for the wafer W in step S200 (the electrical discharge processing execution means, the electrical discharge processing execution step, the electrical discharge processing execution step) under the electrical discharge conditions having been set.

Figure 8:
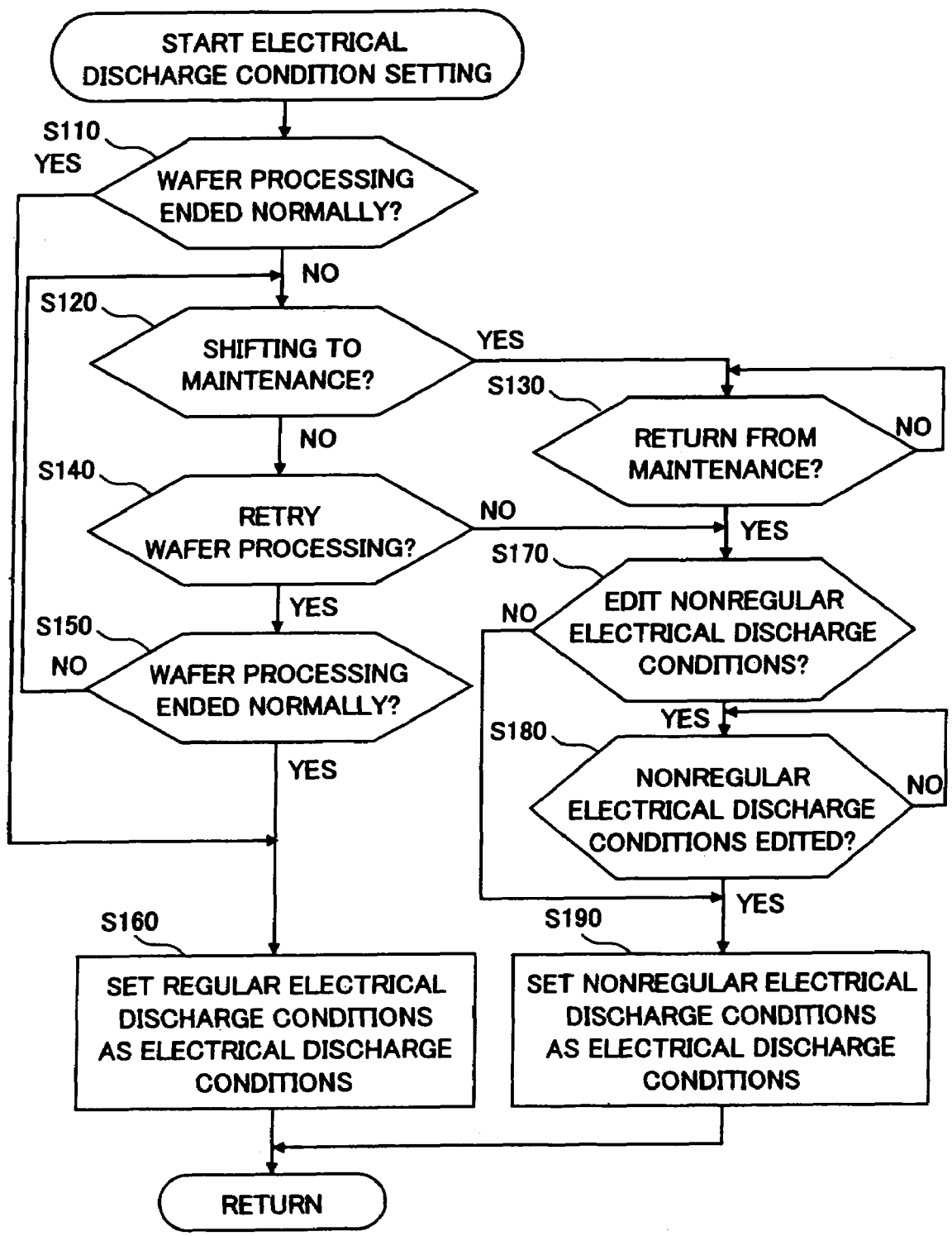
FIG. 8 presents a flowchart of a specific example of the processing executed to set the electrical discharge conditions in FIG. 7.

First, a specific example of the electrical discharge condition setting (executed in step S100) is explained. The electrical discharge conditions may be set through, for instance, a subroutine shown in FIG. 8. A decision is made in step S110 as to whether or not the wafer processing has ended normally. More specifically, through the interlock processing executed by the control unit 200 as explained earlier, a decision is made as to whether or not an abnormal condition has occurred while the wafer processing was in progress, and it is decided that the wafer processing has ended normally if it has ended without experiencing any abnormal condition. If, on the other hand, the wafer processing in progress has been halted due to a failure of the substrate processing apparatus 100, a power outage, a power leak, a process error or the like, it is judged that the wafer processing has not ended normally. It is to be noted that the wafer processing is not judged to have ended normally if the operator has halted the wafer processing via the input/output means 250, regardless of whether or not an abnormal condition has occurred.

If it is decided in step S110 that the wafer processing has ended normally, the regular electrical discharge condition information is set as the electrical discharge conditions in step S160, and in this case, the operation returns to the main routine in FIG. 7 to execute the processing in step S200, since the wafer can be electrically discharged to the full extent through electrical discharge processing executed based upon the regular electrical discharge condition information 284 as long as the wafer processing has ended normally. More specifically, the regular electrical discharge condition information 284 is read from the recipe parameter storage means 280 and the individual parameters are set as the electrical discharge conditions for the electrical discharge processing to be executed.

If it is decided in step S110 that the wafer processing has not ended normally, a decision is made as to whether or not the operation is to shift to maintenance. As explained earlier, if an abnormal condition occurs while the wafer processing is in progress, the operator is alerted to the abnormal condition via the warning means such as an alarm. Under such circumstances, the operator may decide to shift into maintenance processing in order to eliminate the cause of the abnormal condition or repair a faulty component. A decision as to whether or not the operation has shifted to maintenance processing may be made by checking whether or not a shift to maintenance has been selected in a selection screen or the like brought up on display at, for instance, the display means 240.

If it is decided in step S120 that the operation is to shift to maintenance, a decision is made in step S130 as to whether or not the operation has exited the maintenance processing, and if a negative decision is made, the operation awaits an exit from the maintenance processing.

If, on the other hand, it is decided in step S120 that the operation is not to shift to maintenance, a decision is made in step S140 as to whether or not the wafer processing is to be retried. When an abnormal condition occurs while the wafer processing is in progress and the operator is alerted via the warning means such as an alarm, the operator is allowed to choose to retry the wafer processing or halt the wafer processing instead of shifting into the maintenance mode in a selection screen displayed at the display means 240. It is to be noted that the "retry of the wafer processing" in this context may refer to a resumption of the wafer processing where it left off or a re-execution of the wafer processing from the beginning under the same processing conditions.

If it is decided in step S140 that the wafer processing is to be retried, the wafer processing is re-executed under the same processing conditions and a decision is made in step S150 as to whether or not the wafer processing has ended normally. The processing executed in step S150 is similar to that executed in step S10.

If it is decided in step S150 that the wafer processing has not ended normally, the operation returns to step S120. If, on the other hand, it is decided in step S150 that the wafer processing has ended normally, the regular electrical discharge conditions are set as the electrical discharge conditions in step S160, since the wafer W can be electrically discharged under electrical discharge conditions identical to the regular electrical discharge conditions if the re-executed wafer processing has ended normally.

If it is decided in step S130 that the operation has returned from the maintenance processing or if it is decided in step S140 that the wafer processing is not to be retried (e.g., if it is decided that the wafer processing is to be halted), the operation shifts to the processing in step S170 and subsequent steps to be detailed later, through which the non-regular electrical discharge conditions are set as the electrical discharge conditions and then the operation returns to the main routine in FIG. 7 to execute the processing in step S200, since the wafer W, which is held onto the electrostatic chuck with an excessive force, may not be electrically discharged to the full extent under the regular electrical discharge conditions if the operation has just returned from the maintenance processing or the wafer processing is to be halted.

In step S170, a decision is made as to whether or not the non-regular electrical discharge conditions are to be edited, since it may be necessary to edit the non-regular electrical discharge conditions prior to the electrical discharge processing. As a result, the operator is able to edit the non-regular electrical discharge conditions freely by checking the state of the wafer W or based upon past experience.

If it is decided in step S170 that the non-regular electrical discharge conditions are to be edited, the operation waits for the non-regular electrical condition editing to be completed in step S180. Once it is decided in step S180 that the non-regular electrical discharge condition editing has been completed, the non-regular electrical condition information 294 at the apparatus parameter storage means 290 is updated and the edited non-regular electrical discharge conditions are stored. The edited non-regular electrical discharge conditions are then set as the electrical discharge conditions in step S190. More specifically, the updated non-regular electrical discharge condition information 294 is read from the apparatus parameter storage means 290 and the various parameters in the updated non-regular electrical discharge condition information are set as the electrical discharge conditions for the electrical discharge processing to be executed.

If, on the other hand, it is decided in step S170 that the non-regular electrical discharge conditions are not to be edited, the current non-regular electrical discharge conditions are set as the electrical discharge conditions in step S190. In this situation, the default setting values of the individual parameters of the non-regular electrical discharge conditions, for instance, may be set as the electrical discharge conditions. In addition, if the apparatus parameter storage means 290 is constituted with a hard disk, a non-volatile memory or the like and non-regular electrical discharge conditions having been edited in the past are already stored at such an apparatus parameter storage means, the non-regular electrical discharge conditions having been previously edited may be directly set as the electrical discharge conditions.

Next, a specific example of the electrical discharge processing execution (step S200) is explained. The electrical discharge processing may be executed through, for instance, the subroutine in FIG. 9. Namely, the electrical discharge processing is executed in step S210 under the electrical discharge conditions having been set. More specifically, if the regular electrical discharge condition parameters have been set as the electrical discharge conditions through the electrical discharge conditions setting (step S100), the electrical discharge processing is executed based upon the regular electrical discharge condition parameters, whereas the electrical discharge processing is executed based upon the non-regular electrical discharge condition parameters if the non-regular electrical discharge condition parameters have been set as the electrical discharge conditions through the electrical discharge condition setting.

The electrical discharge processing may be executed as follows. First, the processing chamber 102 is evacuated via the discharge device while drawing the processing gas such as N2 gas through a specific gas line of the processing gas supply unit 142 into the processing chamber 102 at the gas flow rate specified in the electrical discharge condition information and the pressure inside the processing chamber 102 is adjusted to a level matching the electrical discharge condition setting.

At this time, if the electrical discharge processing is being executed under the non-regular electrical discharge conditions, the space between the upper surface of the electrostatic chuck 122 and the rear surface of the wafer W is evacuated by controlling the heat transfer gas supply unit 139, so as to prevent the wafer W from popping up while it is being separated from the electrostatic chuck. Namely, if the pressure at the rear surface of the wafer W rises to a level higher than the processing chamber internal pressure, the heat transfer gas remaining in the space between the rear surface of the wafer W and the electrostatic chuck 122 jets out due to the pressure difference between the pressure at the rear surface of the wafer W and the processing chamber internal pressure, causing the wafer W to move on the electrostatic chuck 122 to result in problems such as misalignment of the wafer W and the substance deposited at the edge of the wafer W being lifted off the wafer W to become suspended inside the processing chamber 102 and settling onto the wafer W. The space between the upper surface of the electrostatic chuck and the rear surface of the wafer W is evacuated so as to prevent these problems.

In particular, the electrical discharge processing is executed under the non-regular electrical discharge conditions when the wafer processing has not ended normally due to an occurrence of an abnormal condition or the like, and under such circumstances, the state at the rear surface of the wafer W and the like cannot always be estimated easily, depending upon the cause of the abnormal condition. Thus, the likelihood of the pressure at the rear surface of the wafer W being higher than the processing chamber internal pressure should not be dismissed. Accordingly, when the electrical discharge processing is to be executed under the non-regular electrical discharge conditions, it is desirable to evacuate the area around the rear surface of the wafer W to ensure that the wafer W is not allowed to pop up. When executing the electrical discharge processing under the regular electrical discharge conditions, on the other hand, the pressure at the rear surface of the wafer W and the processing chamber internal pressure are known factors and accordingly, the area around the rear surface of the wafer W needs to be evacuated only if necessary.

Once the pressure inside the processing chamber 102 is adjusted to a level equal to the electrical discharge condition setting, a voltage with the polarity opposite from the polarity of the voltage applied to electrostatically hold the wafer is applied to the electrostatic chuck 122 (reverse voltage application) by switching the switch 127 while sustaining the pressure inside the processing chamber 102 at the electrical discharge condition setting. At this time, the value of the voltage applied to the electrostatic chuck 122 is set to a value indicated as the electrical discharge condition setting. After a predetermined length of time elapses in this state, the reverse voltage application to the electrostatic chuck 122 is turned off, the supply of the processing gas into the processing chamber is stopped and the pressure control inside the processing chamber 102 is stopped.

It is to be noted that the control processing executed for the electrostatic chuck 122 during the electrical discharge processing is not limited to the example described above in which the voltage applied to the electrostatic chuck 122 is set to the electrical discharge condition voltage setting. For instance, changeover control may be executed on the switch 127 of the electrostatic chuck 122 so as to apply the voltage to the electrostatic chuck 122 by repeatedly reversing the polarity of the voltage set to match the electrical discharge condition.

In step S220, a decision is made as to whether or not the electrical discharge processing is being executed normally. During the electrical discharge processing, the interlock processing is executed to make a decision as to whether or not a failure, a power outage, a power leak, an electrical discharge processing error or the like has occurred in the substrate processing apparatus 100. An electrical discharge processing error among these abnormal conditions, in particular, can be detected based upon the allowable limit condition information 292 such as that shown in FIG. 5 by monitoring the detection values provided by the electric parameter sensors, the gas flow rate sensors, the pressure sensors and the like in reference to the electrical discharge condition parameters indicating the voltage applied to the electrostatic check, the gas flow rate, the processing chamber internal pressure and the like.

The interlock processing may be executed as described below as part of the electrical discharge processing. If any of the detection values provided by the sensors in correspondence to the various electrical discharge condition parameters satisfies the allowable limit condition 1 but does not satisfy the allowable limit condition 2, warning processing is executed thereby alerting the operator via the warning means 260 such as an alarm and providing a warning display at the display means 240. In this situation, the number of times the detection value has satisfied the allowable limit condition 1 or the like should be stored into the allowable limit condition information 292 as the electrical discharge processing status.

In addition, if any of the detection values provided by the sensors in correspondence to the electrical discharge condition parameters satisfies the allowable limit condition 2, the operator is alerted via the warning means 260 such as an alarm, an error display is brought up at the display means 240 and the electrical discharge processing is halted.

If it is decided in step S220 that the electrical discharge processing is in progress in a normal manner, e.g., if it is determined through the interlock processing that none of the detection values provided by the sensors satisfy the corresponding allowable limit condition 2, a decision is made in step S230 as to whether or not the electrical discharge processing has ended. If it is decided that the electrical discharge processing has not yet ended, the operation returns to step S210.

If, on the other hand, it is decided in step S220 that the electrical discharge processing is not being executed normally, e.g., if it is determined through the interlock processing that any of the detection values provided by the sensors satisfies the allowable limit condition 2, the electrical discharge processing is halted in step S222 and non-regular electrical discharge condition setting processing is executed in steps S270 through S290. The processing in steps S270 through S290 is similar to that executed in steps S170 through S190 in FIG. 8.

If the electrical discharge processing in progress is halted, due to an occurrence of an abnormal condition, it can be assumed that the wafer W is not fully discharged regardless of the existing electrical discharge conditions. Accordingly, the non-regular electrical discharge conditions are set and re-execution of the electrical discharge processing under the non-regular electrical discharge conditions is enabled in such a case. As a result, the wafer W can be electrically discharged to the full extent.

If it is decided in step S230 that the electrical discharge processing has been completed, the electrical discharge processing status is displayed at the display means 240 in step S240. At this time, an electrical discharge processing retry selection screen may be displayed together with the electrical discharge processing status at the display means 240. In the electrical discharge processing retry selection screen, options "YES" and "NO" may be provided so as to allow the operator to choose whether or not to re-execute the electrical discharge processing.

As the electrical discharge processing status, the numbers of times the individual detection values have satisfied the allowable limit conditions 1, stored as the electrical discharge processing status in the allowable limit condition information 292, as shown in FIG. 5, may be displayed. For instance, if the numbers of times the detection values have satisfied the allowable limit conditions 1 are all 0, it means that the electrical discharge processing has been completed normally without having to issue a warning with regard to the electrical discharge processing even once. If, on the other hand, a given detection value has satisfied the corresponding allowable limit condition 1 once or more, it means that the electrical discharge processing has been completed without the processing state worsening to satisfy the allowable limit condition 2 although a warning has been issued at least once with regard to the electrical discharge processing. Under such circumstances, the operator is able to select the retry option in the electrical discharge selection screen.

Next, in step S250, a decision is made as to whether or not the electrical discharge processing is to be retried. More specifically, it is decided that the electrical discharge processing is to be retried if "YES" has been selected in the electrical discharge selection screen, whereas it is decided that the electrical discharge processing is not to be retried if "NO" has been selected.

If it is decided in step S250 that the electrical discharge processing is to be retried, the non-regular electrical discharge conditions are set in steps S270 through S290, and then the operation returns to step S210 to retry the electrical discharge processing. In other words, since the non-regular electrical discharge conditions can be edited before retrying the electrical discharge processing, the electrical discharge processing can be executed under adjusted electrical discharge conditions. As a result, it is ensured that the wafer W is never detached from the electrostatic chuck 122 unless the wafer W is electrically discharged to the full extent.

Figure 9:
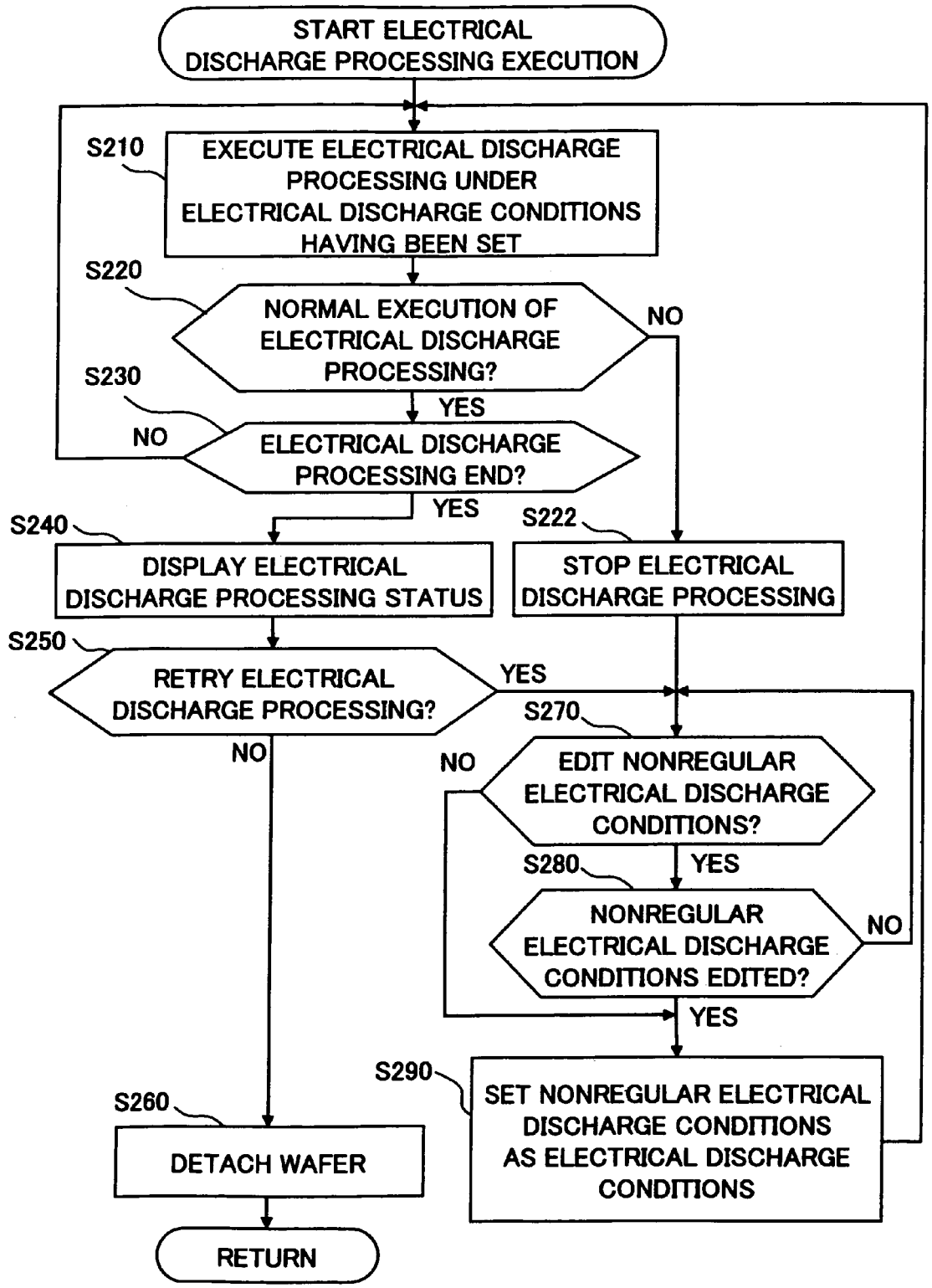
FIG. 9 presents a flowchart of a specific example of the electrical discharge processing execution in FIG. 7.

In addition, until it is decided in step S250 that the electrical discharge processing is not to be retried, the processing in steps S210 through S250 and steps S270 through S290 is repeatedly executed in the flowchart presented in FIG. 9, and thus, the electrical discharge processing can be retried as many times as necessary by adjusting the electrical discharge conditions. As a result, the electrical discharge processing status can be checked as the electrical discharge processing is executing under gradually adjusted electrical discharge conditions, which makes it possible to electrically discharge the wafer W with a higher level of reliability.

If it is decided in step S250 that the electrical discharge processing is not to be retried, the wafer W is detached from the electrostatic chuck 122 in step S260 before the operation returns to the processing shown in FIG. 7 and the sequence of the electrical discharge processing ends. More specifically, the wafer W is detached from the electrostatic chuck 122 at the lower electrode 120 also functioning as the stage by, for instance, pushing up the lift pins, and the electrical discharge processing thus ends. As a result, the wafer W can be electrically discharged to the full extent when the wafer processing has not ended normally as well as when the wafer processing has ended normally, which makes it possible to carry out or remove the wafer W on the transfer arm or the like without allowing the wafer W to become cracked or misaligned.

In addition, it is obvious that the present invention may be achieved by providing a system or an apparatus with a medium such as a storage medium having stored therein a software program for realizing the functions (e.g., the wafer processing function and the electrical discharge processing function) of the embodiment described above and enabling a computer (a CPU or an MPU) in the system or the apparatus to read out and execute the program stored in the medium such as a storage medium.

The functions of the embodiment described above are achieved in the program itself, read out from the medium such as a storage medium, whereas the present invention is embodied in the medium such as a storage medium having the program stored therein. The medium such as a storage medium in which the program is provided may be, for instance, a floppy (registered trademark) disk, a hard disk, an optical disk, a magneto-optical disk, a CD-ROM, a CD-R. a CD-RW, a DVD-ROM, a DVD-RAM, a DVD-RW, a DVD+RW, magnetic tape, a nonvolatile memory card or a ROM, or it may be achieved in the form of a download via a network.

It is to be noted that the scope of the present invention includes an application in which an OS or the like operating on a computer executes the actual processing in part or in whole in response to the instructions in the program read out by the computer and the functions of the embodiment are achieved through the processing thus executed, as well as an application in which the functions of the embodiments are achieved as the computer executes the program it has read out.

The scope of the present invention further includes an application in which the program read out from the medium such as a storage medium is first written into a memory in a function expansion board loaded in a computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to preferred embodiment thereof by referring to the attached drawings, the present invention is not limited to these examples and it will be understood by those skilled in the art that various changes in form and detail may be made therein without departing from the spirit, scope and teaching of the invention.

What is claimed is:

1. A method of electrically discharging a substrate held onto a stage disposed inside a processing chamber of a substrate processing apparatus while the substrate is undergoing work processing before detaching the substrate from said stage, said substrate processing apparatus including, a plurality of gas lines through which processing a processing gas or gasses needed to at least electrically discharge the substrate are supplied, an electrostatic holder configured to electrostatically hold the substrate onto said stage in response to a holding voltage applied thereto, an atmosphere discharge device that discharges the atmosphere within said processing chamber, a normal state electrical discharge condition information store that stores normal state electrical discharge parameters needed for normal state electrical discharge processing when said work processing ends in a normal state, the normal state electrical discharge parameters indicating at least a normal state gas flow rate of said processing gas, a normal state pressure within said processing chamber, and a normal state voltage applied to said electrostatic holder, and a non-normal state electrical discharge condition information store that stores non-normal state electrical discharge parameters needed for non-normal state electrical discharge processing when said work processing ends in a non-normal state different from the normal state, the non-normal state electrical discharge parameters indicating at least a gas line or a plurality of gas lines to be used during non-normal state electrical discharge processing, a non-normal state gas flow rate of said processing gas, a non-normal state pressure within said processing chamber, and a non-normal state voltage applied to said electrostatic holder, said method comprising:

a step of judging whether the work processing has ended in said normal state or in said non-normal state based upon whether or not an abnormality has occurred in said substrate processing apparatus while processing the substrate, before electrically discharging the substrate;

a step of setting normal state electrical discharge conditions based upon said normal state electrical discharge parameters stored in the normal state electrical discharge condition information store when the work processing is judged to have ended in the normal state;

a step of setting the non-normal state electrical discharge conditions based upon said non-normal state electrical discharge parameters stored in the non-normal state electrical discharge condition information store when the work processing is judged to have ended in the non-normal state; and a step of executing normal state electrical discharge processing on the substrate based upon said normal state electrical discharge conditions set in the step of setting normal state electrical discharge conditions by evacuating said processing chamber via said atmosphere discharge device as said processing gas is delivered into said processing chamber at the normal state gas flow rate through a specific gas line so that the pressure inside said processing chamber is adjusted to said normal state pressure while said normal state voltage is applied to said electrostatic holder when the work processing is judged to have ended in said normal state; and a step of executing said non-normal state electrical discharge processing on the substrate based upon the non-normal state electrical discharge conditions set in said step of setting non-normal state electrical discharge conditions by evacuating said processing chamber via said atmosphere discharge device as said processing gas is delivered into said processing chamber at a gas flow rate corresponding to said non-normal state set for the selected single line or at gas flow rates set for the other plurality of gas lines totaling the gas flow rate corresponding to said normal state if said abnormality includes an abnormality in the gas line.

2. The method according to claim 1, wherein:
said step of setting the non-normal state electrical discharge conditions includes a step of judging whether or not the work processing has shifted to maintenance processing and if the operation is judged to have shifted to maintenance processing, said non-normal state electrical discharge conditions are set based upon said non-normal state electrical discharge parameters stored in the non-normal state electrical discharge condition information store upon returning from the maintenance processing.

3. The method according to claim 1, further comprising:
a step of detecting electrical discharge processing status of an active one of normal state electrical discharge processing or non-normal state electrical discharge processing and comparing a detection value indicating said electrical discharge processing status with an allowable limit condition, wherein
said active one of the normal state electrical discharge processing or said non-normal state electrical discharge processing is judged to be in an abnormal state if said detection value indicating said electrical discharge processing status satisfies said allowable limit condition, and said active one of the normal state electrical discharge processing or said non-normal state electrical discharge processing is halted and then retried based upon electrical discharge conditions reset in correspondence to said non-normal state electrical discharge parameters in said non-normal state electrical discharge condition information store.

4. The method according to claim 3, wherein:
said allowable limit condition is set in two stages, as an error condition under which an error is judged to have occurred in said non-normal state electrical discharge processing and a warning condition which is not as serious as said error condition; and
said executing an active one of the normal state electrical discharge processing or said non-normal state electrical discharge processing includes a step in which if said detection value indicating said electrical discharge processing status satisfies said error condition, said active one of the normal state electrical discharge processing or said non-normal state electrical discharge processing is judged to be in an error state and halted, whereas if said detection value indicating said electrical discharge processing status satisfies said warning condition, said active one of the normal state electrical discharge processing or said non-normal state electrical discharge processing is judged to be in a state that warrants a warning and warning processing is executed.

5. The method according to claim 1, further including:
a step of prompting an operator to indicate whether or not to retry said normal state electrical discharge processing or said non-normal state electrical discharge processing upon completion of said active one of said normal state electrical discharge processing or said non-normal state electrical discharge processing on the substrate, and if a retry is indicated, said electrical discharge conditions are set based upon said non-normal state electrical discharge parameters in said non-normal state electrical discharge condition information store.

6. The method according to claim 1, further comprising:
editing said non-normal state electrical discharge condition information.

7. The method according to claim 6, wherein:
the number of editable electrical discharge condition parameters in said non-normal state electrical discharge condition information is greater than the number of normal state electrical discharge condition parameters.

8. The method according to claim I, wherein:
said step of executing said non-normal state electrical discharge processing on the substrate includes;
a step in which the space between the rear surface of the substrate and said stage is evacuated.

9. A method for electrically discharging a substrate according to claim 1, further comprising:
a step of repeatedly reversing the polarity of the voltage applied to the electrostatic holder in an active one of the normal state electrical discharge processing or said non-normal state electrical discharge processing.

10. A substrate processing apparatus that executes work processing on a substrate electrostatically held onto a stage disposed inside a processing chamber of the substrate processing apparatus, the substrate undergoing work processing before detaching the substrate from said stage, comprising:
a plurality of gas lines through which a processing gas or gasses needed to at least electrically discharge the substrate are supplied,
an electrostatic holding means for electrostatically holding the substrate onto said stage in response to a holding voltage applied thereto,
an atmosphere discharge means for discharging the atmosphere within said processing chamber,
a normal state electrical discharge condition information storage means for storing normal state electrical discharge parameters needed for normal state electrical discharge processing when said work processing ends in a normal state, the normal state electrical discharge parameters indicating at least a normal state gas flow rate of said processing gas, a normal state pressure within said processing chamber, and a normal state voltage applied to said electrostatic holding means, and
a non-normal state electrical discharge condition information storage means for storing non-normal state electrical discharge parameters needed for non-normal state electrical discharge processing when said work processing ends in a non-normal state different from the normal state, the non-normal state electrical discharge parameters indicating at least a gas line or a plurality of gas lines to be used during non-normal state electrical discharge processing, a non-normal state gas flow rate of said processing gas, a non-normal state pressure within said processing chamber, and a non-normal state voltage applied to said electrostatic holding means;
an electrical discharge condition setting means for making a decision as to whether or not the work processing on the substrate has ended in said normal state or said non-normal state based upon whether or not an abnormality has occurred in said substrate processing apparatus while processing the substrate, before electrically discharging the substrate, and for setting normal state parameters as electrical discharge conditions based upon said regular electrical discharge condition information stored in said normal state electrical discharge condition information storage means when the work processing is decided to have ended in said normal state and for setting non-normal state electrical discharge conditions based upon said non-normal state electrical discharge condition information stored in said non-normal state electrical discharge condition information storage means when the work processing is decided to have ended in said non-normal state; and an electrical discharge processing execution means for executing said electrical discharge processing on the substrate based upon said electrical discharge conditions having been set by said electrical discharge condition setting means so that when the work processing has ended in a normal state, said electrical discharge processing is executed on the substrate based upon said normal state parameters set by said electrical discharge condition setting means by evacuating said processing chamber via said atmosphere discharge means as said processing gas is delivered into said processing chamber at the normal state gas flow rate through one or more of said gas lines so that the pressure inside said processing chamber is adjusted to said normal state pressure while said normal state voltage is applied to said electrostatic holding means, and when the work processing has ended in said non-normal state, said electrical discharge processing is executed on the substrate based upon the non-normal state parameters set as said non-normal state electrical discharge conditions through said electrical discharge condition setting means by evacuating said processing chamber via said atmosphere discharge means as said processing gas is delivered into said processing chamber at a gas flow rate corresponding to said non-normal state set for the selected single line or at gas flow rates set for the other plurality of gas lines totaling the gas flow rate corresponding to said normal state if said abnormality includes an abnormality in the gas line.

11. The substrate processing apparatus according to claim 10, wherein:
said electrical discharge condition setting means makes a decision when the processing of the substrate has ended in the non-normal state and as to whether or not the work processing has shifted to maintenance processing and when the work processing is determined to have shifted to maintenance processing sets said electrical discharge conditions based upon said non-normal electrical discharge condition information upon returning from said maintenance processing.

12. The substrate processing apparatus according to claim 10, wherein:
said electrical discharge processing execution means detects an electrical discharge processing status, compares a detection value indicating said electrical discharge processing status with an allowable limit condition, judges said electrical discharge processing to be in an abnormal state if said detection value indicating said electrical discharge processing status satisfies said allowable limit condition, halts said electrical discharge processing and retries said electrical discharge processing based upon electrical discharge conditions reset in correspondence to said non-normal state electrical discharge conditions at said non-regular electrical discharge condition information storage means.

13. The substrate processing apparatus according to claim 10, wherein:
said allowable limit condition is set in two stages, as an error condition under which an error is judged to have occurred in said electrical discharge processing and a warning condition which is not as serious as said error condition; and
said electrical discharge processing means judges that said electrical discharge processing is in an error state and halts said electrical discharge processing if said detection value indicating said electrical discharge processing status satisfies said error condition but judges that said electrical discharge processing is in a state that warrants a warning and executes warning processing if said detection value indicating said electrical discharge processing status satisfies said warning condition.

14. The substrate processing apparatus according to claim 10, wherein:
said electrical discharge processing execution means prompts an operator to indicate whether or not to retry said electrical discharge processing upon completion of said electrical discharge processing on the substrate, and if a retry of said electrical discharge processing is indicated, said electrical discharge processing execution means sets electrical discharge conditions based upon said non-normal state electrical discharge condition information at said non-regular electrical discharge condition information storage means.

15. The substrate processing apparatus according to claim 10, further comprising:
input means for editing said non-normal state electrical discharge condition information.

16. The substrate processing apparatus according to claim 15, wherein:
the number of editable electrical discharge condition parameters in said non-normal state electrical discharge condition information is greater than the number of electrical discharge condition parameters in said normal state electrical discharge condition information.

17. The substrate processing apparatus according to claim 10, wherein:
said electrical discharge processing executed under said electrical discharge conditions set based upon said non-normal state electrical discharge condition information includes;
processing through which the space between the rear surface of the substrate and said stage is evacuated.

18. The substrate processing apparatus according to claim 10, further comprising:
means for repeatedly reversing polarity of the voltage applied to the electrostatic holding means.

19. A computer readable program on a tangible storage medium for controlling a computer to carry out a method of electrical discharge processing on a substrate held onto a stage disposed inside a processing chamber of a substrate processing apparatus while the substrate is undergoing work processing before detaching the substrate from said stage, said substrate processing apparatus including,
a plurality of gas lines through which processing a processing gas or gasses needed to at least electrically discharge the substrate are supplied,
an electrostatic holder configured to electrostatically hold the substrate onto said stage in response to a holding voltage applied thereto,
an atmosphere discharge device that discharges the atmosphere within said processing chamber,
a normal state electrical discharge condition information store that stores normal state electrical discharge parameters needed for normal state electrical discharge processing when said work processing ends in a normal state, the normal state electrical discharge parameters indicating at least a normal state gas flow rate of said processing gas, a normal state pressure within said processing chamber, and a normal state voltage applied to said electrostatic holder, and a non-normal state electrical discharge condition information store that stores non-normal state electrical discharge parameters needed for non-normal state electrical discharge processing when said work processing ends in a non-normal state different from the normal state, the non-normal state electrical discharge parameters indicating at least a gas line or a plurality of gas lines to be used during non-normal state electrical discharge processing, a non-normal state gas flow rate of said processing gas, a non-normal state pressure within said processing chamber, and a non-normal state voltage applied to said electrostatic holder, said method of electrical discharge processing being executed by the computer comprising:

a step of judging whether the work processing has ended in said normal state or in said non-normal state based upon whether or not an abnormality has occurred in said substrate processing apparatus while processing the substrate, before electrically discharging the substrate;

a step of setting normal state electrical discharge conditions based upon said normal state electrical discharge parameters stored in the normal state electrical discharge condition information store when the work processing is judged to have ended in the normal state;

a step of setting the non-normal state electrical discharge conditions based upon said non-normal state electrical discharge parameters stored in the non-normal state electrical discharge condition information store when the work processing is judged to have ended in the non-normal state; and a step of executing normal state electrical discharge processing on the substrate based upon said normal state electrical discharge conditions set in said step of setting normal state electrical discharge conditions by evacuating said processing chamber via said atmosphere discharge device as said processing gas is delivered into said processing chamber at the normal state gas flow rate through a specific gas line so that the pressure inside said processing chamber is adjusted to said normal state pressure while said normal state voltage is applied to said electrostatic holder when the work processing is judged to have ended in said normal state; and a step of executing said non-normal state electrical discharge processing on the substrate based upon the non-normal state electrical discharge conditions set in said step of setting non-normal state electrical discharge conditions by evacuating said processing chamber via said atmosphere discharge device as said processing gas is delivered into said processing chamber at a gas flow rate corresponding to said non-normal state set for the selected single line or at gas flow rates set for the other plurality of gas lines totaling the gas flow rate corresponding to said normal state if said abnormality includes an abnormality in the gas line.

20. The computer readable program on a tangible storage medium according to claim 19, wherein:
said step of setting the non-normal state electrical discharge conditions includes a step of judging whether or not the work processing has shifted to maintenance processing and if the work processing is judged to have shifted to maintenance processing, said non-normal state electrical discharge conditions are set based upon said non-normal state electrical discharge parameters stored in the non-normal state electrical discharge condition information store upon returning from the maintenance processing.

21. The computer readable program on a tangible storage medium according to claim 19, wherein:
said electrical discharge processing execution step includes a step of detecting electrical discharge processing status of an active one of the normal state electrical discharge processing or said non-normal state electrical discharge processing, and comparing a detection value indicating said electrical discharge processing status with an allowable limit condition, wherein
said active one of the normal state electrical discharge processing or said non-normal state electrical discharge processing is judged to be in an abnormal state if said detection value indicating said electrical discharge processing status satisfies said allowable limit condition, and said active one of the normal state electrical discharge processing or said non- normal state electrical discharge processing is halted and then retried based upon electrical discharge conditions reset in correspondence to said non-normal state electrical discharge parameters in said non-normal state electrical discharge condition information store.

22. The computer readable program on a tangible storage medium according to claim 21, wherein:
said allowable limit condition is set in two stages, as an error condition under which an error is judged to have occurred in said non-normal state electrical discharge processing and a warning condition which is not as serious as said error condition; and
said step of executing an active one of the normal state electrical discharge processing or said step of executing said non-normal state electrical discharge processing execution includes:
a step in which, if said detection value indicating said electrical discharge processing status satisfies said error condition, said active one of the normal state electrical discharge processing or said non-normal state electrical discharge processing is judged to be in an error state and is halted, whereas if said detection value indicating said electrical discharge processing status satisfies said warning condition, said active one of the normal state electrical discharge processing or said non-normal state electrical discharge processing is judged to be in a state that warrants a warning and warning processing is executed.

23. The computer readable program on a tangible storage medium according to claim 19, further comprising:
a step of prompting an operator to indicate whether or not to retry an active one of said normal state electrical discharge processing or said non-normal state electrical discharge processing upon completion of said an active one of said normal state electrical discharge processing or said non-normal state electrical discharge processing on the substrate, and if a retry is indicated, said electrical discharge conditions are set based upon said non-normal state electrical discharge parameters in said non-normal state electrical discharge condition information store.

24. The computer readable program on a tangible storage medium according to claim 19, further comprising:
said non-regular electrical discharge condition information.

25. The computer readable program on a tangible storage medium according to claim 24, wherein:
the number of editable electrical discharge condition parameters in said non-normal state electrical discharge condition information is greater than the number of electrical discharge condition parameters in said normal state electrical discharge condition information.

26. The computer readable program on a tangible storage medium according to claims 19, wherein:
said step of executing said non-normal state electrical discharge processing on the substrate includes;
a step in which the space between the rear surface of the substrate and said stage is evacuated.

27. The computer readable program on a tangible storage medium according to claim 19, further comprising:

a step of repeatedly reversing the polarity of the voltage applied to the electrostatic holder in an active one of normal state electrical discharge processing or of non-normal state electrical discharge processing.

* * * * *